(12) United States Patent
Aida et al.

(10) Patent No.: US 11,177,357 B2
(45) Date of Patent: Nov. 16, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kikuo Aida, Oita Oita (JP); Kenji Maeyama, Kanagawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,129

(22) Filed: Sep. 4, 2020

(65) Prior Publication Data

US 2021/0296456 A1 Sep. 23, 2021

(30) Foreign Application Priority Data

Mar. 17, 2020 (JP) .............................. JP2020-046499

(51) Int. Cl.
*H01L 29/78* (2006.01)
*H01L 29/417* (2006.01)
(Continued)

(52) U.S. Cl.
CPC .... *H01L 29/41741* (2013.01); *H01L 29/4236* (2013.01); *H01L 29/456* (2013.01);
(Continued)

(58) Field of Classification Search
CPC ....... H01L 29/40; H01L 29/407; H01L 29/41; H01L 29/417; H01L 29/4174;
(Continued)

(56) References Cited

U.S. PATENT DOCUMENTS 6,642,600 B2 * 11/2003 Narazaki ........... H01L 29/66348
257/513
6,888,196 B2 5/2005 Kobayashi
(Continued)

FOREIGN PATENT DOCUMENTS

JP 2006-140263 A 6/2006
JP 4004843 B2 11/2007
(Continued)

*Primary Examiner* — Monica D Harrison
(74) *Attorney, Agent, or Firm* — Allen & Overy, LLP

(57) ABSTRACT

A semiconductor device includes a semiconductor part, first and second electrodes and a control electrode. The semiconductor part is provided between the first and second electrode. The control electrode is provided in a trench between the semiconductor part and the second electrode. The semiconductor part includes first and second layers. Between the first layer of a first conductivity type and the second electrode, the second layer of a second conductivity type is provided. The second electrode includes first and second contact portions. The first contact portion extends into the second layer. The second contact portion contacts a surface of the semiconductor part. In the second layer, the first contact portion has a first width at a first position and a second width at a second position. The first position is positioned between the first electrode and the second position. The first width is larger than the second width.

14 Claims, 10 Drawing Sheets

(51) Int. Cl.
*H01L 29/423* (2006.01)
*H01L 29/45* (2006.01)
*H01L 29/66* (2006.01)
*H01L 29/40* (2006.01)

(52) U.S. Cl.
CPC .... *H01L 29/66727* (2013.01); *H01L 29/7813* (2013.01); *H01L 29/407* (2013.01); *H01L 29/66734* (2013.01)

(58) Field of Classification Search
CPC . H01L 29/41741; H01L 29/42; H01L 29/423; H01L 29/4236; H01L 29/45; H01L 29/456; H01L 29/66; H01L 29/667; H01L 29/6672; H01L 29/66727; H01L 29/6673; H01L 29/66734; H01L 29/78; H01L 29/781; H01L 29/7813
USPC ........................................................ 257/330
See application file for complete search history.

(56) References Cited

U.S. PATENT DOCUMENTS

| | | |
|---|---|---|
| 2008/0150018 A1 | 6/2008 | Tanabe |
| 2012/0205670 A1 | 8/2012 | Kudou et al. |
| 2013/0221431 A1 | 8/2013 | Musha et al. |
| 2013/0221498 A1 | 8/2013 | Hayashi |
| 2016/0093719 A1 | 3/2016 | Kobayashi et al. |
| 2016/0260808 A1 | 9/2016 | Kobayashi |

FOREIGN PATENT DOCUMENTS

| | | |
|---|---|---|
| JP | 2008-160039 A | 7/2008 |
| JP | 5075280 B2 | 11/2012 |
| JP | 2013-182934 A | 9/2013 |
| JP | 2013-182935 A | 9/2013 |
| JP | 2016-072482 A | 5/2016 |
| JP | 2016-163019 A | 9/2016 |

* cited by examiner

SEMICONDUCTOR DEVICE

CROSS-REFERENCE TO RELATED APPLICATIONS

This application is based upon and claims the benefit of priority from Japanese Patent Application No. 2020-046499, filed on Mar. 17, 2020; the entire contents of which are incorporated herein by reference.

FIELD

Embodiments relate to a semiconductor device.

BACKGROUND

It is desirable to reduce the on-resistance of a power semiconductor device.

DETAILED DESCRIPTION

Figure 1:
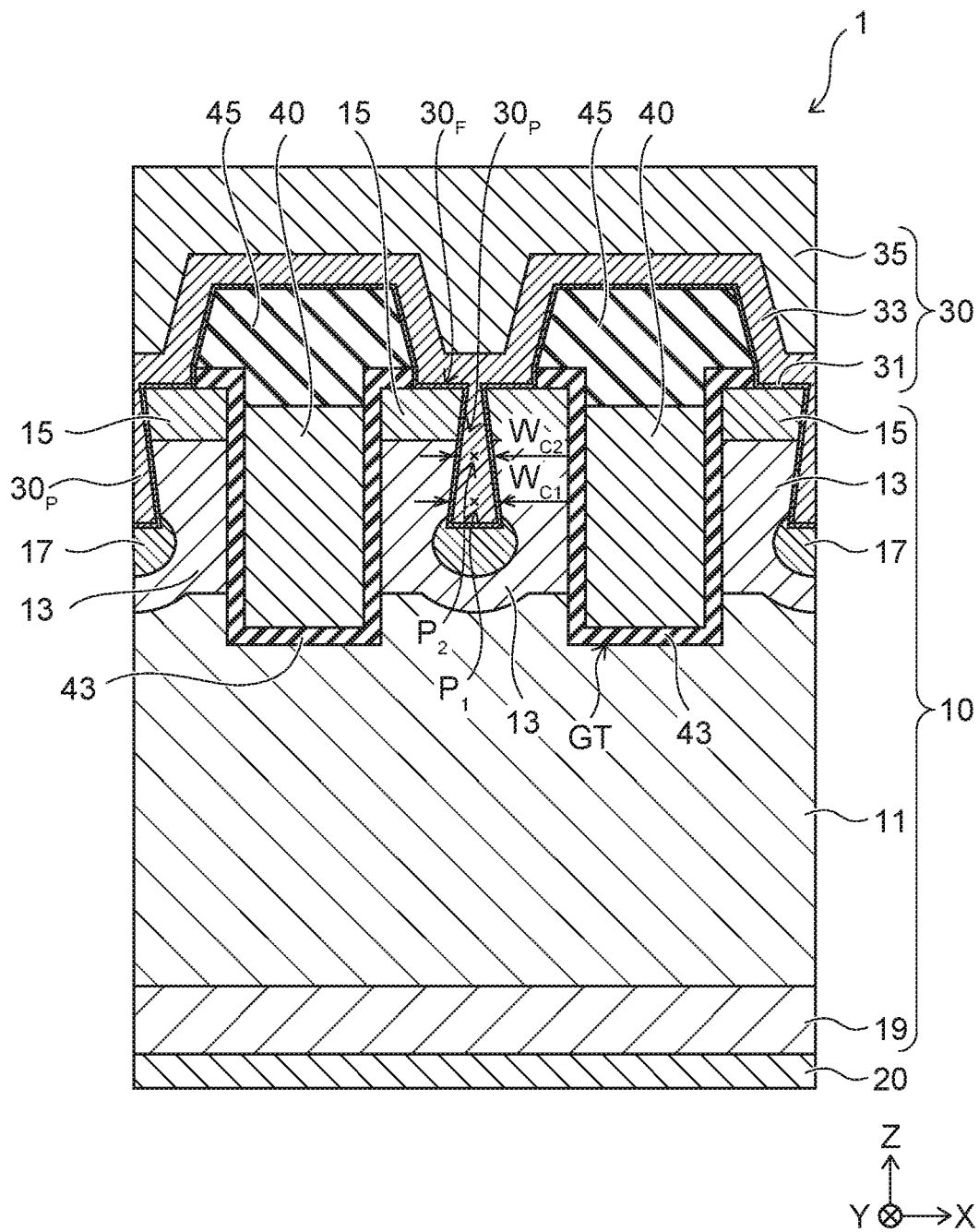
FIG. 1 is a schematic cross-sectional view showing a semiconductor device according to an embodiment.

According to one embodiment, a semiconductor device includes a semiconductor part, first and second electrodes and a control electrode. The semiconductor part has a trench at a front surface side. The first electrode is provided at a back surface side of the semiconductor part. The second electrode is provided at the front surface side of the semiconductor part. The second electrode includes a first contact portion and a second contact portion. The first contact portion extends into the semiconductor part in a first direction from the second electrode to the first electrode. The second contact portion contacts the front surface of the semiconductor part. The control electrode is provided between the semiconductor part and the second electrode. The control electrode is provided inside the trench of the semiconductor part. The control electrode is electrically insulated from the semiconductor part by a first insulating film and electrically insulated from the second electrode by a second insulating film. The semiconductor part includes a first layer of a first conductivity type, a second layer of a second conductivity type, and a third layer of the first conductivity type. The first layer extends between the first and second electrodes. The trench extends in the first direction and reaching the front surface. The second layer is provided between the first layer and the second electrode. The second layer faces the control electrode via the first insulating film. The first contact portion of the second electrode extends into the second layer from the front surface of the semiconductor part. The third layer is provided between the second layer and the second electrode. The third layer is electrically connected to the second electrode. The third layer contacts the first insulating film, the first contact portion, and the second contact portion. The first contact portion of the second electrode has first and second widths in a second direction from the control electrode toward the first contact portion of the second electrode. The first width at a first position is greater than the second width at a second position. The first and second positions are arranged in the first direction in the first contact portion of the second electrode. The first position is positioned between the first electrode and the second position.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a trench-gate MOSFET.

As shown in FIG. 1, the semiconductor device 1 includes a semiconductor part 10, a first electrode (hereinbelow, a drain electrode 20), a second electrode (hereinbelow, a source electrode 30), and a control electrode (hereinbelow, a gate electrode 40). The semiconductor part 10 is, for example, silicon.

The drain electrode 20 is provided at the back surface side of the semiconductor part 10. The drain electrode 20 is a metal layer including aluminum, gold, etc.

The source electrode 30 is provided at the front surface side of the semiconductor part 10. In other words, the semiconductor part 10 is provided between the drain electrode 20 and the source electrode 30.

The source electrode 30 is, for example, a metal layer having a stacked structure including a first metal layer 31, a second metal layer 33, and a third metal layer 35. The first metal layer 31, the second metal layer 33, and the third metal layer 35 are stacked in order at the front surface side of the semiconductor part 10.

The first metal layer 31 includes, for example, titanium nitride (TiN). The first metal layer 31 is provided between the semiconductor part 10 and the second metal layer 33.

The second metal layer 33 includes, for example, tungsten (W). The second metal layer 33 is provided between the first metal layer 31 and the third metal layer 35.

The third metal layer 35 includes, for example, aluminum (Al). For example, the third metal layer 35 is thicker than the total of the layer thickness of the first metal layer 31 and the layer thickness of the second metal layer 33.

The source electrode 30 includes a first contact portion $30_P$ and a second contact portion $30_F$. The first contact portion $30_P$ extends into the semiconductor part 10. The second contact portion $30_F$ contacts the front surface of the semiconductor part 10 exposed to a space between mutually-adjacent inter-layer insulating films 45.

The gate electrode 40 is provided between the semiconductor part 10 and the source electrode 30. The gate electrode 40 is disposed inside a gate trench GT provided in the semiconductor part 10. The gate electrode 40 is electrically insulated from the semiconductor part 10 by a first insulating film (hereinbelow, a gate insulating film 43). Also, the gate electrode 40 is electrically insulated from the source electrode 30 by a second insulating film (hereinbelow, the inter-layer insulating film 45).

The semiconductor part 10 includes a first layer of a first conductivity type (hereinbelow, an n-type drift layer 11), a second layer of a second conductivity type (hereinbelow, a p-type diffusion layer 13), a third layer of the first conductivity type (hereinbelow, an n-type source layer 15), a fourth layer of the second conductivity type (hereinbelow, a p-type contact layer 17), and a fifth layer of the first conductivity type (hereinbelow, an n-type buffer layer 19).

The n-type drift layer 11 extends between the drain electrode 20 and the source electrode 30. The gate trench GT has a depth reaching the n-type drift layer 11 from the front surface of the semiconductor part 10.

The p-type diffusion layer 13 is provided between the n-type drift layer 11 and the source electrode 30. The p-type diffusion layer 13 faces the gate electrode 40 via the gate insulating film 43.

The n-type source layer 15 is provided between the p-type diffusion layer 13 and the source electrode 30. The n-type source layer 15 is provided between the gate insulating film 43 and the side surface of the first contact portion $30_P$. The n-type source layer 15 contacts the gate insulating film 43, the first contact portion 30, and the second contact portion $30_F$. The n-type source layer 15 is electrically connected to the source electrode 30. The n-type source layer 15 includes an n-type impurity with a higher concentration than a concentration of the n-type impurity in the n-type drift layer 11.

The p-type contact layer 17 is selectively provided between the p-type diffusion layer 13 and the source electrode 30. The p-type contact layer 17 is provided between the p-type diffusion layer 13 and the first contact portion $30_P$. For example, the p-type contact layer 17 is provided inside the p-type diffusion layer 13. The p-type contact layer 17 includes a p-type impurity with a higher concentration than a concentration of the p-type impurity in the p-type diffusion layer 13.

The p-type contact layer 17 contacts the first contact portion $30_P$ and is electrically connected to the source electrode 30. The p-type diffusion layer 13 is electrically connected to the source electrode 30 via the p-type contact layer 17.

The n-type buffer layer 19 is provided between the n-type drift layer 11 and the drain electrode 20. The n-type buffer layer 19 includes an n-type impurity with a higher concentration than the concentration of the n-type impurity in the n-type drift layer 11. For example, the drain electrode 20 contacts the n-type buffer layer 19 and is electrically connected to the n-type buffer layer 19.

As shown in FIG. 1, the source electrode 30 is electrically connected to the n-type source layer 15 via the first contact portion $30_P$ and the second contact portion $30_F$. Also, the source electrode 30 is electrically connected to the p-type contact layer 17 via the first contact portion $30_P$.

The p-type diffusion layer 13 includes a convex region bulging toward the n-type drift layer 11 between two adjacent gate electrodes 40 of the multiple gate electrodes 40 arranged in the X-direction. The p-type contact layer 17 is provided between the first contact portion $30_P$ and the convex region.

The tip of the first contact portion $30_P$ widens into the semiconductor part 10 away from the source electrode 30. The first contact portion $30_P$ includes, for example, a first position P. and a second position $P_2$ in a first direction (hereinbelow, the Z-direction) which is from the drain electrode 20 toward the source electrode 30. In a second direction (hereinbelow, the X-direction) which is from the gate electrode 40 toward the first contact portion $30_P$ along the front surface of the semiconductor part 10, the first contact portion $30_P$ has a first width $W_{C1}$ at the first position $P_1$, and a second width $W_{C2}$ at the second position $P_2$. The first position $P_1$ is positioned between the drain electrode 20 and the second position $P_2$, and the first width Wei is greater than the second width $W_{C2}$.

The p-type diffusion layer 13 includes a portion positioned between the p-type contact layer 17 and the gate insulating film 43. The p-type diffusion layer 13 has a narrower width in the X-direction at the portion positioned between the p-type contact layer 17 and the gate insulating film 43 than the width in the X-direction of the n-type source layer 15.

The second contact portion $30_F$ is provided between the first contact portion $30_P$ and the end of the inter-layer insulating film 45 in the X-direction. The second contact portion $30_F$ contacts the front surface of the semiconductor part 10 (i.e., the front surface of the n-type source layer 15).

Figure 2:
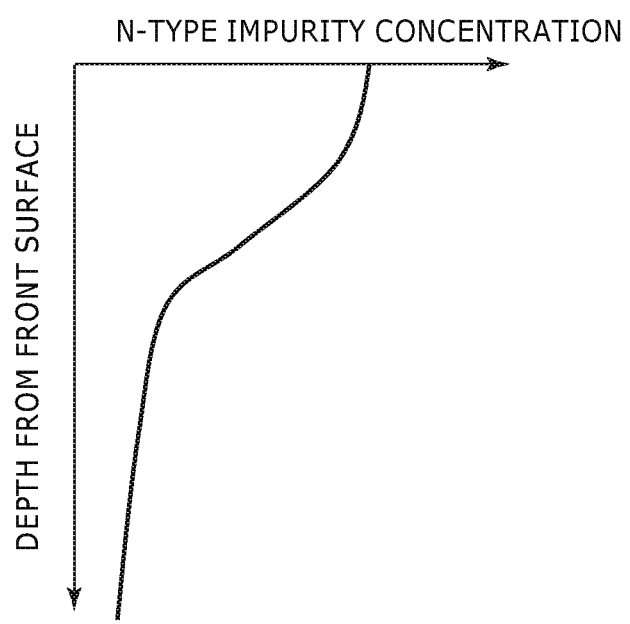
FIG. 2 is a schematic cross-sectional view showing a characteristic of the semiconductor device according to the embodiment.

FIG. 2 is a schematic cross-sectional view showing a characteristic of the semiconductor device 1 according to the embodiment. FIG. 2 is a schematic view showing the n-type impurity distribution inside the n-type source layer 15.

As shown in FIG. 2, the n-type impurity concentration in the n-type source layer 15 is highest at the front surface and decreases in the depth direction. Therefore, the first contact portion $30_F$ and the second contact portion $30_F$ that contact the n-type source layer 15 has non-equivalent contact resistances to the n-type source layer 15. The second contact portion $30_F$ contacting the front surface of the n-type source layer 15 has the contact resistance less than the contact resistance of the first contact portion $30_P$ contacting the side surface of the n-type source layer 15. In other words, the contact resistance between the n-type source layer 15 and the source electrode 30 can be reduced by increasing the surface area of the second contact portion $30_F$.

Figure 10A:
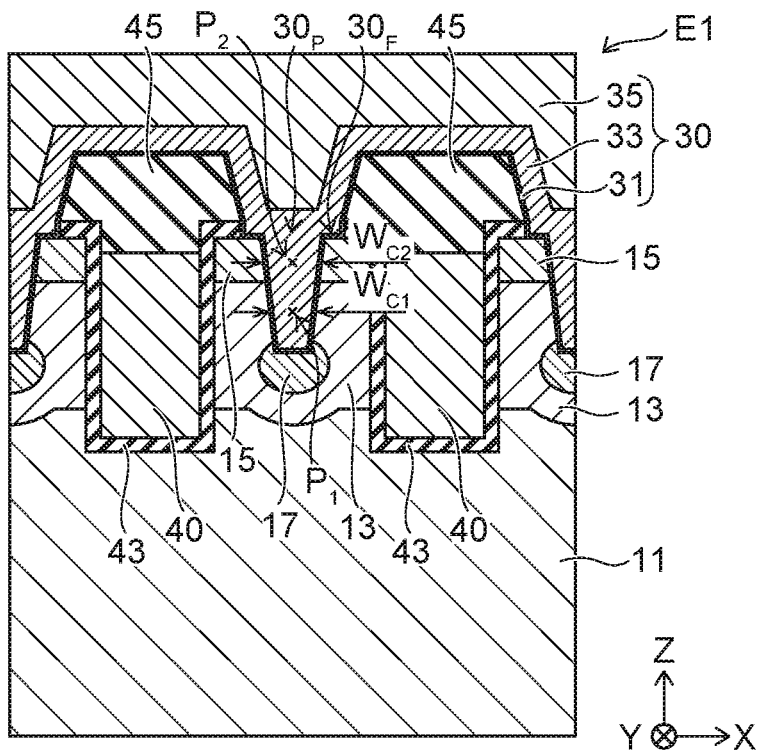
FIGS. 10A and 10B are schematic cross-sectional views showing semiconductor devices according to comparative examples.

For example, in a semiconductor device E1 shown in FIG. 10A, the tip of the first contact portion $30_F$ becomes narrow into the semiconductor part 10. In other words, the first width $W_{C1}$ in the X-direction at the first position $P_1$ is less than the second width $W_{C2}$ at the second position $P_2$.

If the p-type contact layer 17 of the semiconductor device E1 has the same size as the p-type contact layer 17 of the semiconductor device 1, for example, the surface area of the second contact portion $30_F$ is narrower in the semiconductor device E1 compared to the surface area of the second contact portion $30_F$ of the semiconductor device 1. Therefore, in the semiconductor device E1, the contact resistance increases between the n-type source layer 15 and the source electrode 30, and thus, the on-resistance increases.

Figure 10B:
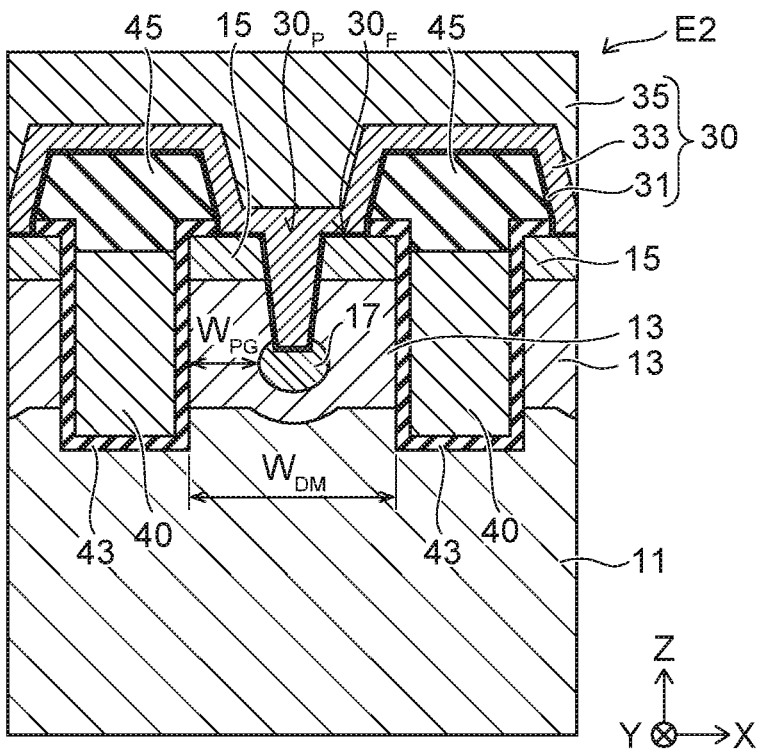

In a semiconductor device E2 shown in FIG. 10B, the tip of the first contact portion $30_Y$ also becomes narrow into the semiconductor part 10. Compared to the semiconductor device E1, the arrangement spacing in the X-direction of the gate electrodes 40 in the semiconductor device E2 is increased, and a width $W_{DM}$ of the semiconductor part 10 between the mutually-adjacent gate electrodes 40 is increased. Thereby, the surface area of the second contact portion $30_F$ is increased, and the contact resistance is reduced between the n-type source layer 15 and the source electrode 30.

When the width $W_{DM}$ of the semiconductor part 10 is increased, however, a width $W_{PG}$ is increased between the p-type contact layer 17 and the gate insulating film 43. In such a case, the avalanche resistance is reduced while turning off the semiconductor device E2. In other words, the ejection path lengthens for the holes generated by the avalanche phenomenon due to the electric field concentrated at the lower end of the gate electrode 40, and the resistance to the hole current increases. Also, when the width $W_{DM}$ of the semiconductor part 10 is increased, the density of the inversion channel induced at the interface between the p-type diffusion layer 13 and the gate insulating film 43 is reduced, and the channel resistance increases.

In contrast, in the semiconductor device 1, the tip of the first contact portion $30_P$ widens into the semiconductor part 10 and the surface area of the second contact portion $30_F$ can be increased without reducing the avalanche resistance or without reducing the channel density. The on-resistance of the semiconductor device 1 can be reduced thereby.

A method for manufacturing the semiconductor device 1 will now be described with reference to FIGS. 3A to 7B. FIGS. 3A to 7B are schematic cross-sectional views showing manufacturing processes of the semiconductor device 1 according to the embodiment.

Figure 3A:
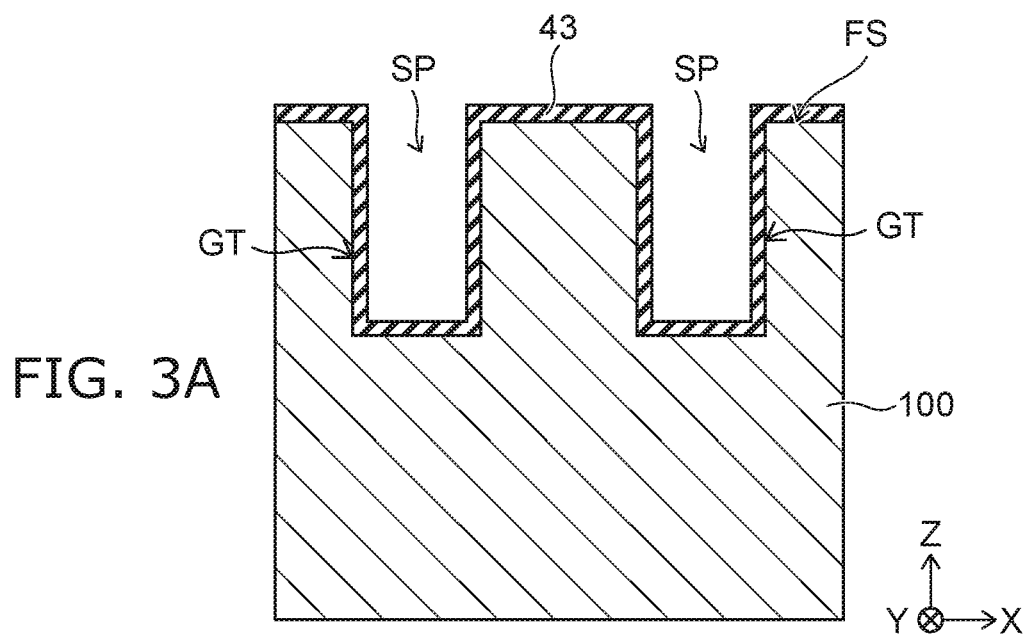
FIGS. 3A to 7B are schematic cross-sectional views showing manufacturing processes of the semiconductor device according to the embodiment.

As shown in FIG. 3A, the gate insulating film 43 is formed after forming the gate trench GT in a front surface FS side of a semiconductor wafer 100. The semiconductor wafer 100 is, for example, an n-type silicon wafer. The semiconductor wafer 100 includes an n-type impurity with the same concentration as the concentration of the n-type impurity of the n-type drift layer 11.

For example, the gate trench GT is formed by selectively etching the semiconductor wafer 100 by using anisotropic RIE (Reactive Ion Etching). The gate insulating film 43 is, for example, a silicon oxide film formed by thermal oxidation. The gate insulating film 43 is formed to have a thickness such that a space SP remains inside the gate trench GT.

Figure 3B:
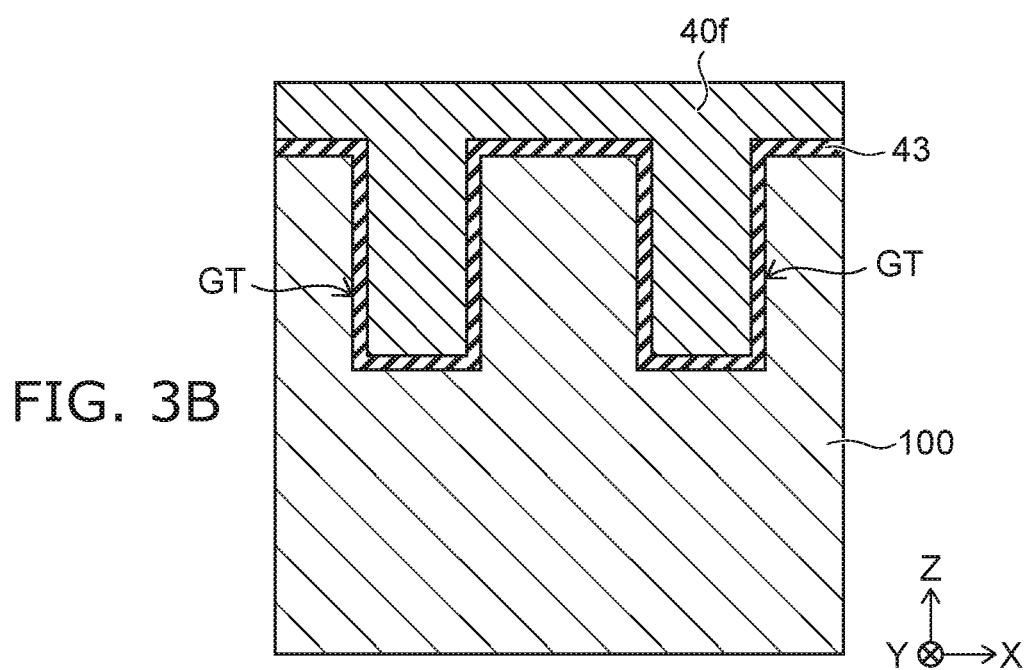

As shown in FIG. 3B, a conductive layer 40f is formed at the front surface FS side of the semiconductor wafer 100. The conductive layer 40f is, for example, polysilicon. The conductive layer 40f is formed to fill the space SP inside the gate trench GT. For example, the conductive layer 40f is formed using CVD (Chemical Vapor Deposition).

Figure 4A:
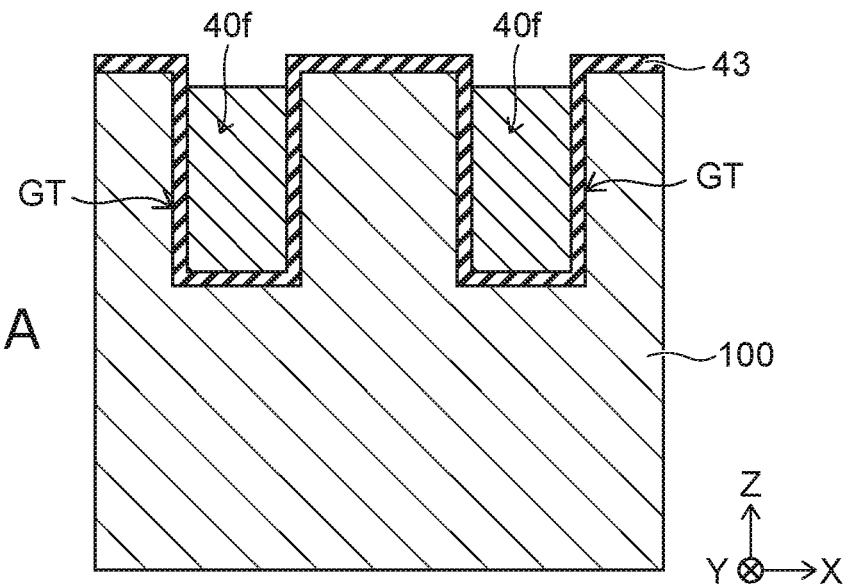

As shown in FIG. 4A, the conductive layer 40f is removed so that a portion thereof remains inside the gate trench GT. For example, the conductive layer 40f is removed using isotropic dry etching. The portion that remains inside the gate trench GT is the gate electrode 40.

Figure 4B:
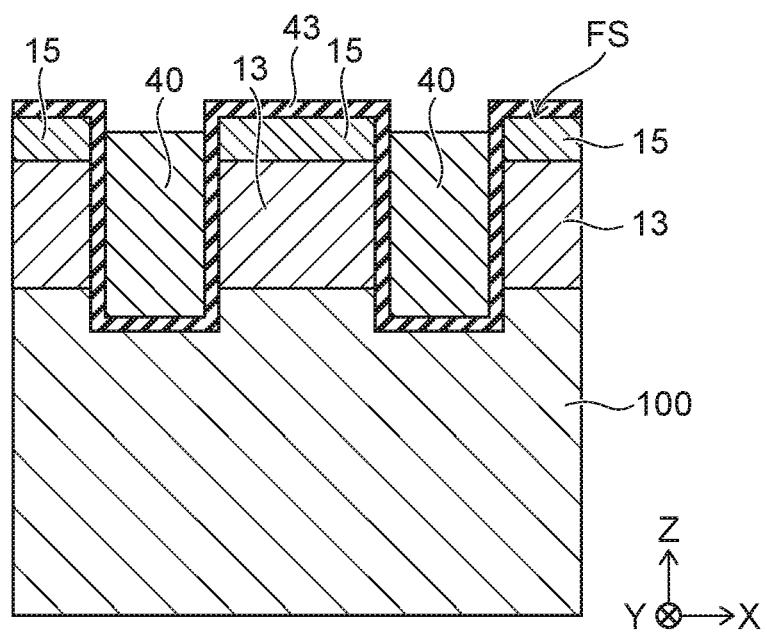

As shown in FIG. 4B, the n-type source layer 15 is formed after forming the p-type diffusion layer 13 at the front surface FS side of the semiconductor wafer 100.

The p-type diffusion layer 13 is formed by ion-implanting a p-type impurity such as boron (B) into the semiconductor wafer 100 and by activating the p-type impurity by heat treatment. The p-type diffusion layer 13 also is formed by the diffusion of the p-type impurity while the heat treatment. The p-type diffusion layer 13 faces the gate electrode 40 via the gate insulating film 43.

The n-type source layer 15 is formed by ion-implanting an n-type impurity such as phosphorus (P) into the semiconductor wafer 100 and by activating the n-type impurity by heat treatment. The n-type source layer 15 is formed so that the depth from the front surface FS of the semiconductor part 10 is less than the depth of the p-type diffusion layer 13 from the front surface FS.

Figure 5A:
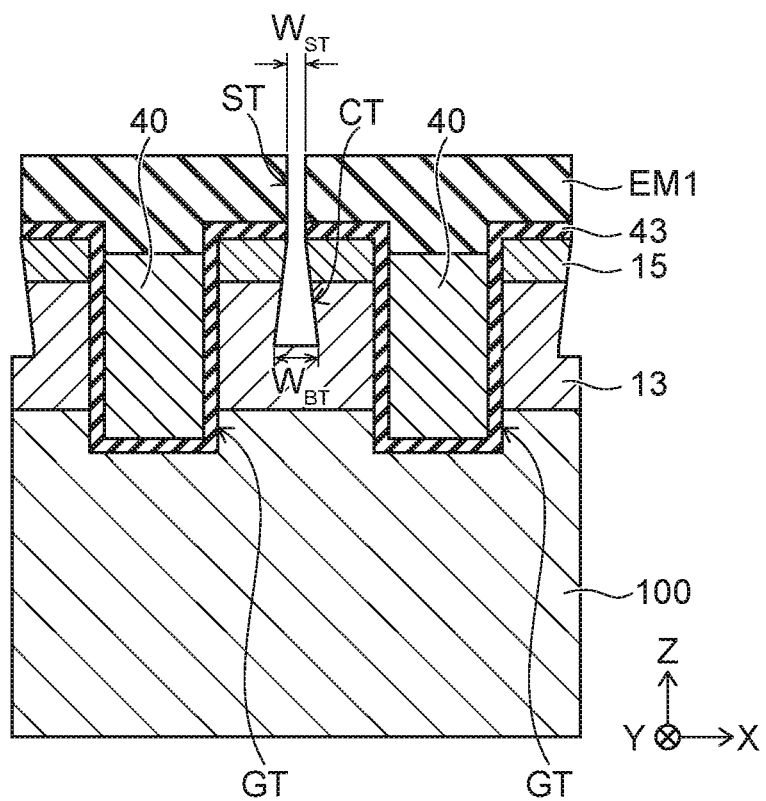

As shown in FIG. 5A, a contact trench CT is formed after forming an etching mask EM1 at the front surface FS side of the semiconductor wafer 100. For example, the contact trench CT is formed by selectively etching the semiconductor wafer 100 via an opening ST of the etching mask EM1. The etching mask EM1 is, for example, a silicon oxide film.

For example, the contact trench CT is formed to a depth reaching the p-type diffusion layer 13 from the front surface FS of the semiconductor wafer 100. For example, the bottom surface of the contact trench CT is positioned inside the p-type diffusion layer 13.

The contact trench CT is formed by selectively etching the semiconductor wafer 100 by, for example, anisotropic RIE. At this time, the etching conditions such as the high frequency power, the degree of vacuum, etc., are set so that a width WBT in the X-direction of the bottom surface of the contact trench CT is greater than a width WST in the X-direction of the opening ST.

Figure 5B:
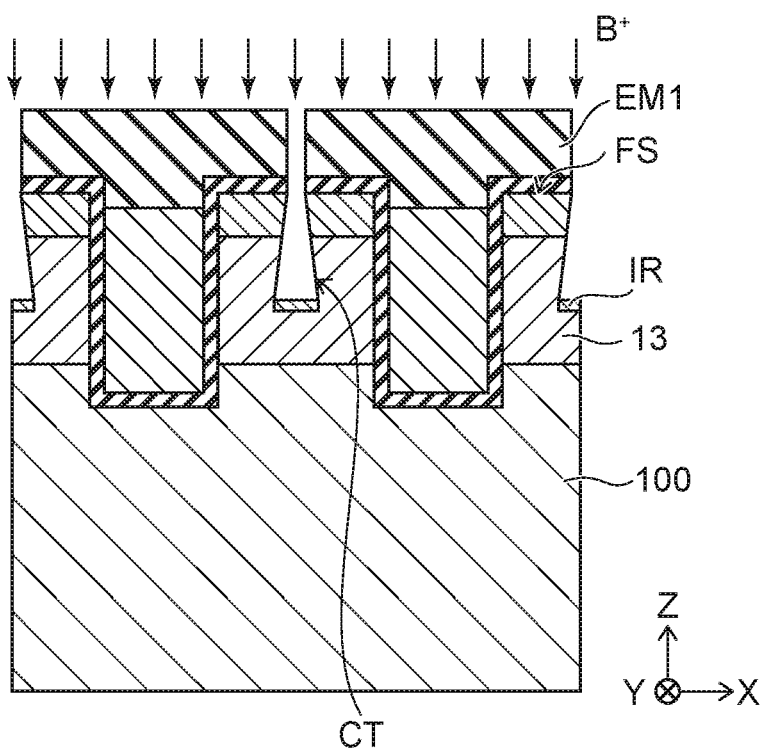

As shown in FIG. 5B, a p-type impurity such as boron (B) is ion-implanted into the front surface FS side of the semiconductor wafer 100 while the etching mask EM1 remains. Thereby, an implantation region IR is formed at the bottom surface of the contact trench CT. The implantation region IR includes the p-type impurity. After removing the etching mask EM1, the p-type impurity in the implantation region IR is activated by heat treatment.

Figure 6A:
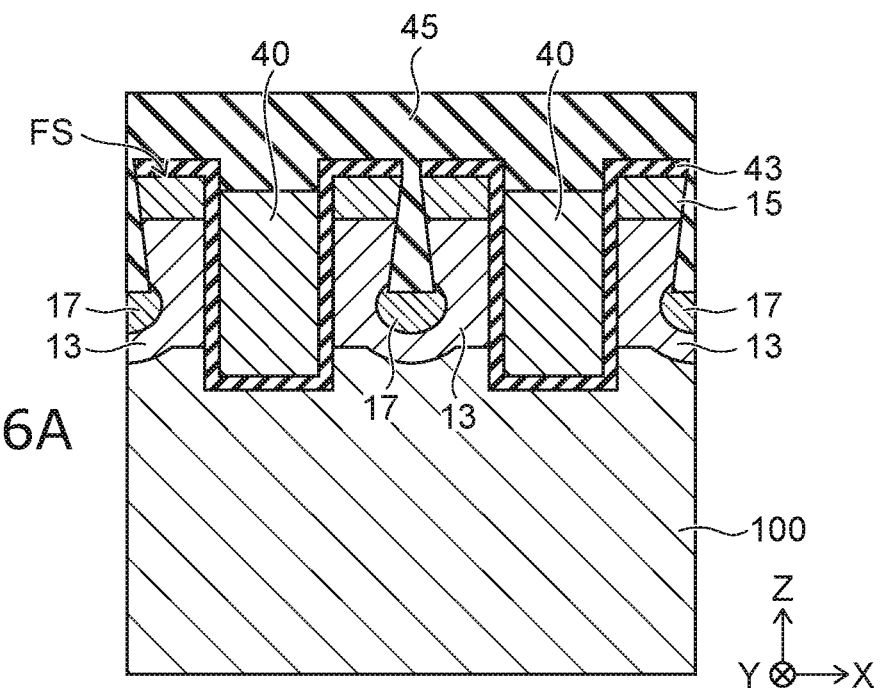

As shown in FIG. 6A, the inter-layer insulating film 45 is formed after forming the p-type contact layer 17 under the contact trench CT. The p-type contact layer 17 is formed by activating the p-type impurity of the implantation region IR.

The inter-layer insulating film 45 is, for example, a silicon oxide film formed using CVD. The inter-layer insulating film 45 is formed to cover the front surface FS side of the semiconductor wafer 100. The inter-layer insulating film 45 may be formed to fill the contact trench CT or may be formed so that a void remains inside the contact trench CT.

Figure 6B:
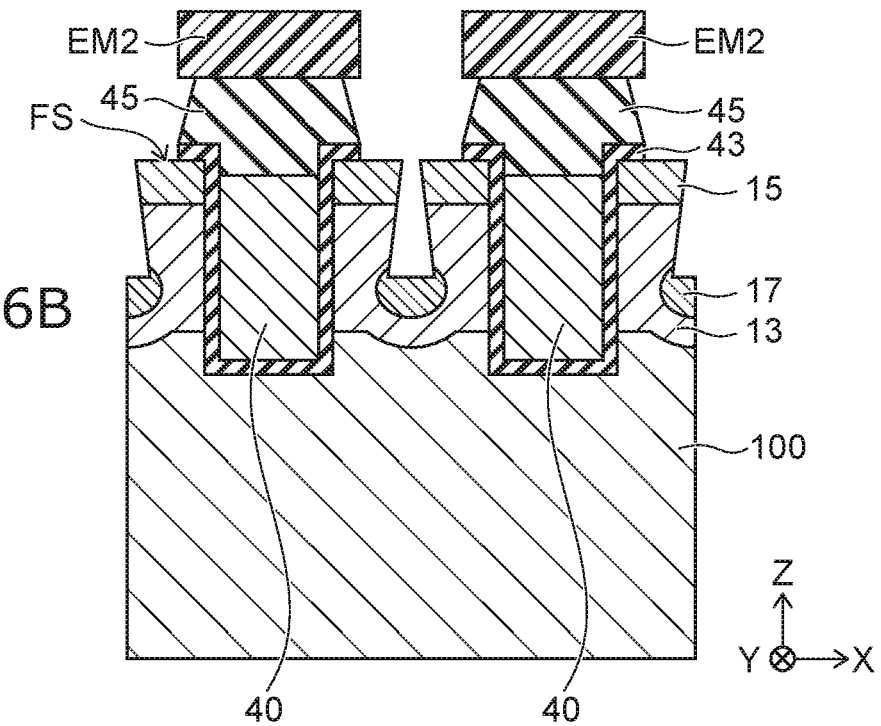

As shown in FIG. 6B, the inter-layer insulating film 45 is selectively removed after forming an etching mask EM2 on the inter-layer insulating film 45. The inter-layer insulating film 45 is removed so that a portion thereof that covers the gate electrode 40 remains. For example, the inter-layer insulating film 45 is removed by dry etching. The etching mask EM2 is, for example, a resist mask.

Figure 7A:
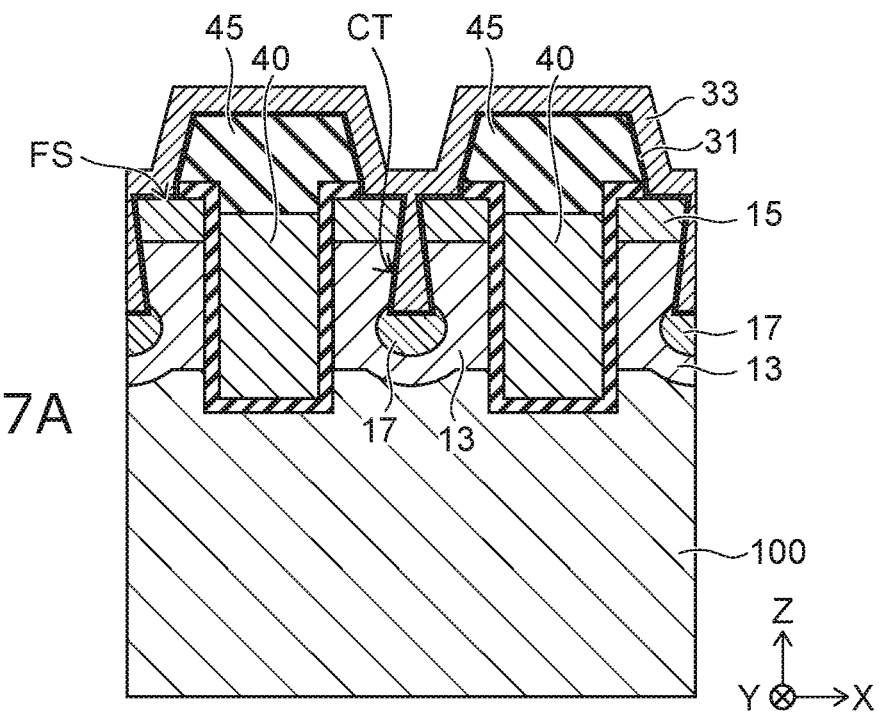

As shown in FIG. 7A, the first metal layer 31 and the second metal layer 33 are formed to cover the front surface FS side of the semiconductor wafer 100. For example, the first metal layer 31 is a titanium nitride layer formed using sputtering. The second metal layer 33 is, for example, a tungsten layer formed using CVD.

The first metal layer 31 is formed to cover the inter-layer insulating film 45, the n-type source layer 15 exposed at the front surface FS side of the semiconductor part 10, and the inner surface of the contact trench CT. The second metal layer 33 is formed to fill the contact trench CT.

Figure 7B:
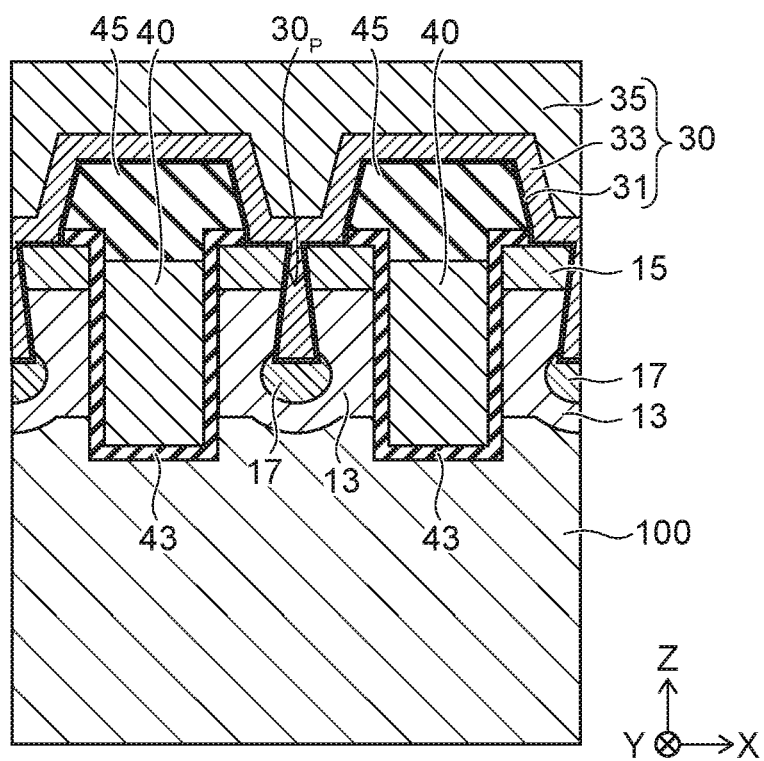

As shown in FIG. 7B, the third metal layer 35 is formed on the second metal layer 33. The third metal layer 35 is, for example, an aluminum layer formed using sputtering. Continuing, the back surface side of the semiconductor wafer 100 is thinned to a prescribed thickness by polishing.

Subsequently, the n-type buffer layer 19 is formed by ion-implanting an n-type impurity such as phosphorus (P) into the back surface side of the semiconductor wafer 100 (referring to FIG. 1). The semiconductor device 1 is completed by forming the drain electrode 20 on the back surface. The portion of the semiconductor wafer 100 is the n-type drift layer 11, which is positioned between the n-type buffer layer 19 and the p-type diffusion layer 13.

Figure 8A:
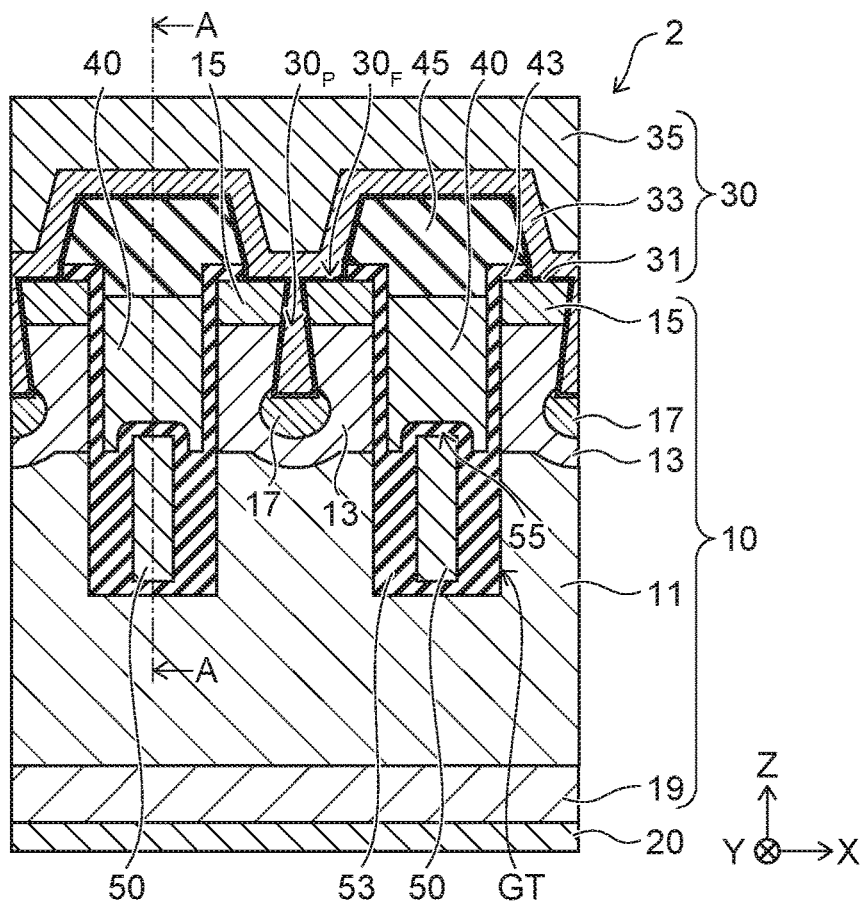
FIGS. 8A and 8B are schematic cross-sectional views showing a semiconductor device according to a modification of the embodiment.
Figure 8B:
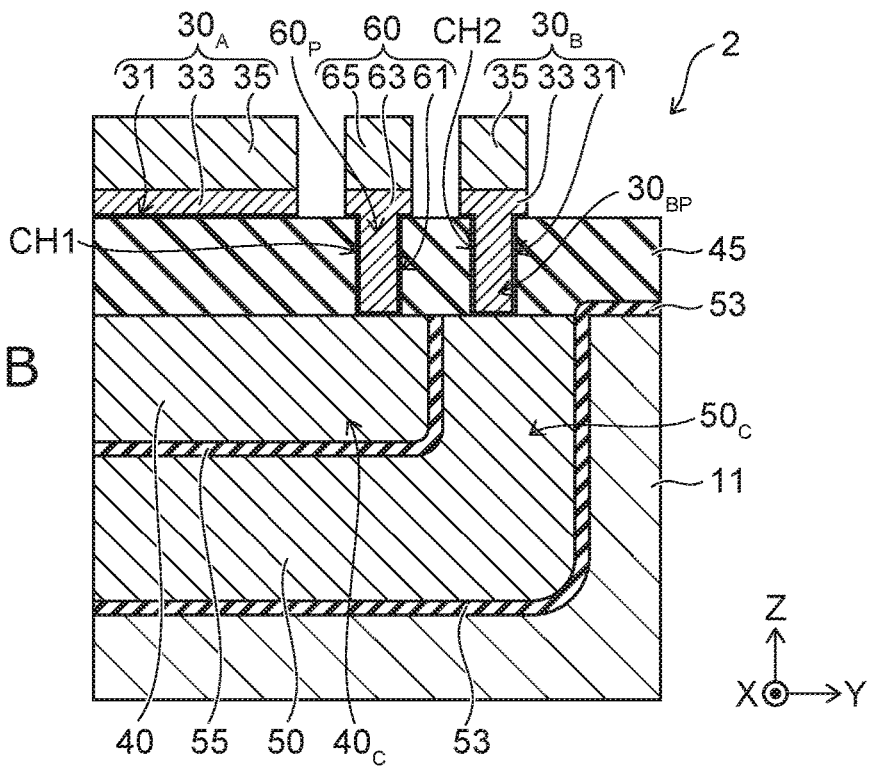

FIGS. 8A and 8B are schematic cross-sectional views showing a semiconductor device 2 according to a modification of the embodiment. FIG. 8B is a cross-sectional view along line A-A shown in FIG. 8A. A description is omitted as appropriate for the same configuration as the semiconductor device 1.

As shown in FIG. 8A, the source electrode 30 of the semiconductor device 2 includes the first contact portion $30_F$ and the second contact portion $30_F$. The tip of the first contact portion $30_F$ widens into the semiconductor part 10. Thereby, the surface area of the second contact portion $30_F$ can be increased, and the on-resistance can be reduced.

The semiconductor device 2 further includes a third electrode (hereinbelow, a field plate 50) provided with the gate electrode 40 inside the gate trench GT. The field plate 50 is provided between the drain electrode 20 and the gate electrode 40. The field plate 50 is electrically insulated from the n-type drift layer 11 by a third insulating film (hereinbelow, an insulating film 53). Also, the field plate 50 is electrically insulated from the gate electrode 40 by a fourth insulating film (hereinbelow, an insulating film 55). The field plate 50 is, for example, conductive polysilicon. The insulating film 53 and the insulating film 55 are, for example, silicon oxide films.

As shown in FIG. 8B, inside the gate trench GT, the gate electrode 40 extends in a direction, e.g., the Y-direction along the front surface of the semiconductor part 10. The gate electrode 40 includes, for example, a gate connection portion $40_C$ provided at the end in the Y-direction. The gate electrode 40 is electrically connected to a gate interconnect 60.

For example, the gate interconnect 60 has a stacked structure including a first metal layer 61, a second metal layer 63, and a third metal layer 65. The first metal layer 61 is, for example, a titanium nitride layer. The second metal layer 63 is, for example, a tungsten layer. The third metal layer 65 is, for example, an aluminum layer.

The gate interconnect 60 includes a contact portion $60_P$ extending into a contact hole CH1 in the inter-layer insulating film 45. The contact portion $60_P$ contacts the gate connection portion $40_C$ and electrically connects the gate electrode 40 to the gate interconnect 60. The contact portion 60 includes a portion of the first metal layer 61 contacting the gate electrode 40, and a portion of the second metal layer 63 filled into the contact hole CH1.

The field plate 50 extends in the Y-direction inside the gate trench GT. The field plate 50 includes a connection portion $50_C$ at the Y-direction end. The connection portion $50_C$ extends in the Z-direction along the gate connection portion $40_C$ of the gate electrode 40. The connection portion $50_C$ is electrically connected to an extension portion $30_B$ of the source electrode 30.

The source electrode 30 includes a major portion $30_A$ electrically connected to the n-type source layer 15 and the p-type contact layer 17, and the extension portion $30_B$ extending along the front surface of the inter-layer insulating film 45 from the major portion $30_A$. The extension portion $30_B$ includes a contact portion $30_{BP}$.

The contact portion $30_{BP}$ extends into a contact hole CH2 in the inter-layer insulating film 45 and contacts the connection portion $50_C$. The contact portion $30_{BP}$ includes a portion of the first metal layer 31 contacting the field plate 50, and a portion of the second metal layer 33 filled into the contact hole CH2. The contact portion $30_{BP}$ electrically connects the field plate 50 to the source electrode 30.

Figure 9A:
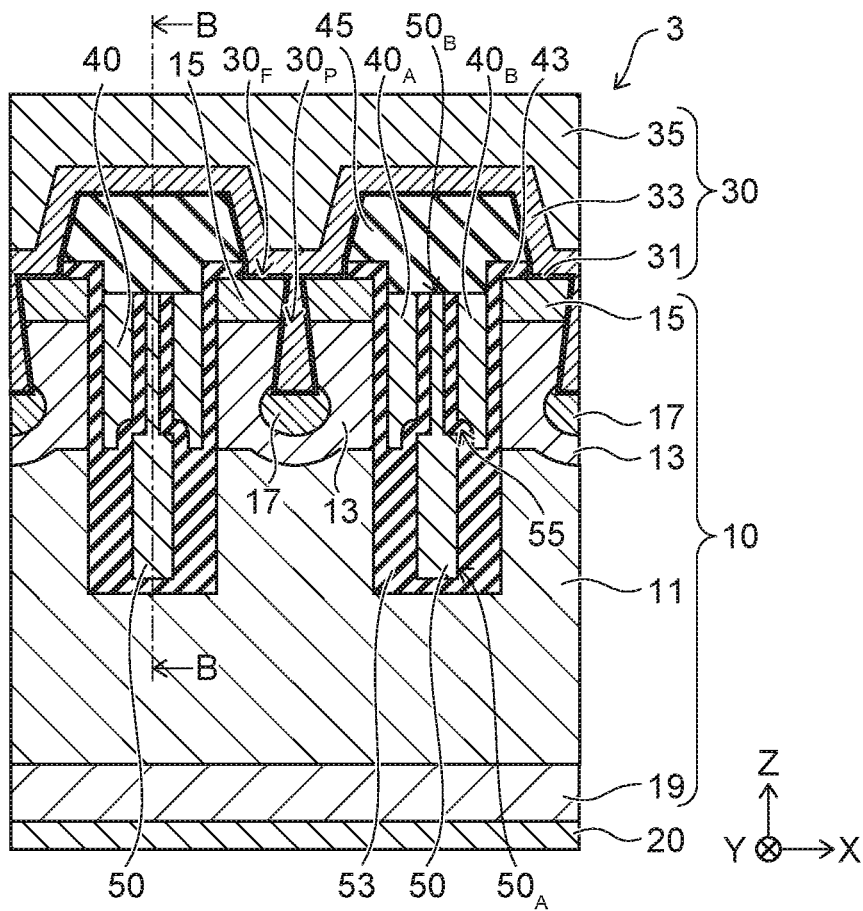
FIGS. 9A and 9B are schematic cross-sectional views showing a semiconductor device according to another modification of the embodiment.
Figure 9B:
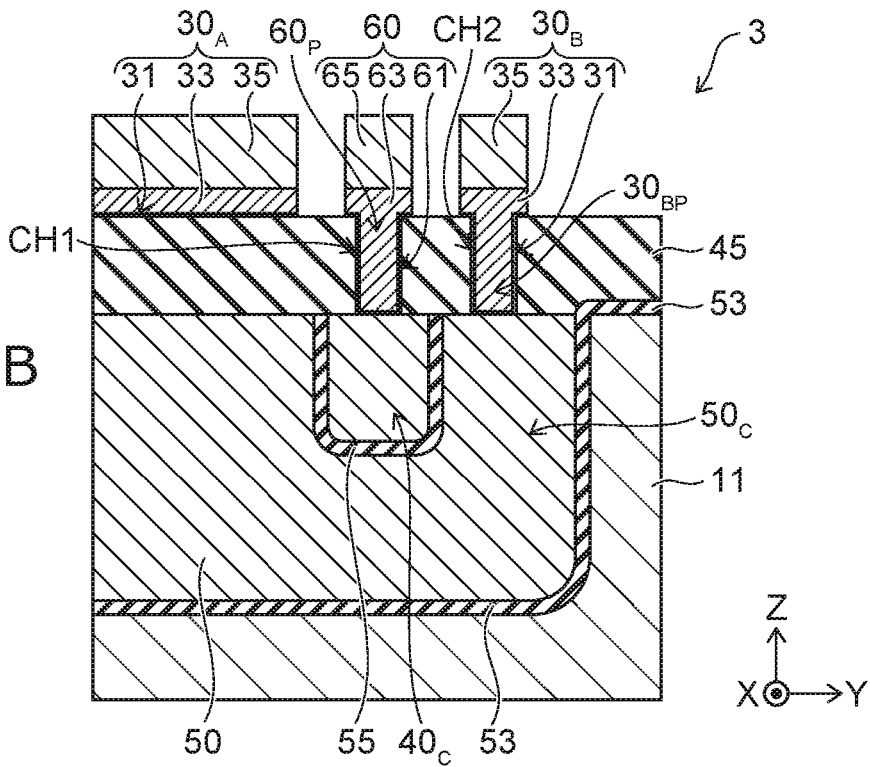

FIGS. 9A and 9B are schematic cross-sectional views showing a semiconductor device 3 according to another modification of the embodiment. FIG. 9B is a cross-sectional view along line B-B shown in FIG. 9A. A description is omitted as appropriate for the same configuration as the semiconductor device 1.

As shown in FIG. 9A, the source electrode 30 of the semiconductor device 3 includes the first contact portion $30_F$ and the second contact portion $30_F$. The tip of the first contact portion $30_F$ widens into the semiconductor part 10. Thereby, the surface area of the second contact portion $30_F$ can be increased, and the on-resistance can be reduced.

The semiconductor device 3 further includes the field plate 50 disposed with the gate electrode 40 inside the gate trench GT. The gate electrode 40 includes a first gate electrode $40_A$ and a second gate electrode $40_B$ arranged in the X-direction. The field plate 50 includes a first portion $50_A$ and a second portion $50_B$.

The first portion $50_A$ is disposed more proximate than the gate electrode 40 to the drain electrode 20 in the Z-direction. The first portion $50_A$ is electrically insulated from the n-type drift layer 11 by the insulating film 53.

The second portion $50_B$ extends between the first gate electrode $40_A$ and the second gate electrode $40_B$. The second portion $50_B$ is electrically insulated from the first gate electrode $40_A$ and the second gate electrode $40_B$ by the insulating film 55.

As shown in FIG. 9B, the gate connection portion $40_C$ of the gate electrode 40 is provided between the field plate 50 and the gate interconnect 60. The gate electrode $40_A$ and the gate electrode $40_B$ each are connected to the gate connection portion $40_C$ at the Y-direction ends of the gate electrode $40_A$ and the gate electrode $40_B$.

The contact portion $60_P$ of the gate interconnect 60 contacts the gate connection portion $40_C$ and electrically connects the gate electrode $40_A$ and the gate electrode $40_B$ to the gate interconnect 60.

The field plate 50 extends in the Y-direction inside the gate trench GT. The field plate 50 includes the connection portion $50_C$ at the Y-direction end. The connection portion $50_C$ is electrically connected to the extension portion $30_B$ of the source electrode 30 via the contact portion $30_{BP}$ of the extension portion $30_B$. The contact portion $30_{BP}$ electrically connects the field plate 50 to the source electrode 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part having a trench at a front surface side;
a first electrode provided at a back surface side of the semiconductor part;
a second electrode provided at the front surface side of the semiconductor part, the second electrode including a first contact portion and a second contact portion, the first contact portion extending into the semiconductor part in a first direction from the second electrode to the first electrode, the second contact portion contacting the front surface of the semiconductor part; and
a control electrode provided between the semiconductor part and the second electrode, the control electrode being provided inside the trench of the semiconductor part, the control electrode being electrically insulated from the semiconductor part by a first insulating film and electrically insulated from the second electrode by a second insulating film,
the semiconductor part including a first layer of a first conductivity type, a second layer of a second conductivity type, and a third layer of the first conductivity type,
the first layer extending between the first and second electrodes, the trench extending in the first direction and reaching the first layer,
the second layer being provided between the first layer and the second electrode, the second layer facing the control electrode via the first insulating film, the first contact portion of the second electrode extending into the second layer from the front surface of the semiconductor part,
the third layer being provided between the second layer and the second electrode, the third layer being electrically connected to the second electrode, the third layer contacting the first insulating film, the first contact portion, and the second contact portion,
the first contact portion of the second electrode having first and second widths in a second direction from the control electrode toward the first contact portion of the second electrode, the first width at a first position being greater than the second width at a second position, the first and second positions being arranged in the first direction in the first contact portion of the second electrode, the first position being positioned between the first electrode and the second position.

2. The device according to claim 1, wherein
the semiconductor part further includes a fourth layer of the second conductivity type provided between the second layer and the first contact portion, the fourth layer contacting the first contact portion, the fourth layer including a second-conductivity-type impurity with a higher concentration than a concentration of a second-conductivity-type impurity in the second layer, the fourth layer being electrically connected to the second electrode.

3. The device according to claim 2, wherein
the fourth layer of the semiconductor part is provided inside the second layer, and the second layer is electrically connected to the second electrode via the fourth layer.

4. The device according to claim 2, wherein
the second layer of the semiconductor part includes a portion positioned between the fourth layer and the first insulating film.

5. The device according to claim 4, wherein
the portion of the second layer has a narrower width in the second direction than a width in the second direction of the third layer.

6. The device according to claim 2, wherein
the second layer of the semiconductor part includes a convex region bulging toward the first layer, and
the fourth layer of the semiconductor part is provided between the first contact portion and the convex region.

7. The device according to claim 1, wherein
the third layer of the semiconductor part is provided between the first insulating film and a side surface of the first contact portion, the third layer contacts the side surface of the first contact portion.

8. The device according to claim 1, wherein
the second contact portion of the second electrode is provided between the first contact portion and an end of the second insulating film in the second direction.

9. The device according to claim 1, further comprising:
a third electrode provided inside the trench of the semiconductor part, the third electrode including a portion more proximate than the control electrode to the first electrode in the first direction,
the third electrode being electrically insulated from the first layer of the semiconductor part by a third insulating film and electrically insulated from the control electrode by a fourth insulating film, the third electrode being electrically connected to the second electrode.

10. The device according to claim 9, wherein
the control electrode includes a first portion and a second portion arranged in the second direction, and
the third electrode extends between the first and second portions.

11. The device according to claim 9, wherein
the third electrode is provided between the first electrode and the control electrode.

12. The device according to claim 9, wherein
the third electrode faces the first layer of the semiconductor part via the fourth insulating film.

13. The device according to claim 1, wherein
the second electrode includes a first metal layer, a second metal layer, and a third metal layer, the first metal layer contacting the second and third layers of the semiconductor part, the second metal layer being provided between the first and third metal layers, and
the first contact portion includes the first and second metal layers.

14. The device according to claim 13, wherein
the first metal layer includes titanium nitride,
the second metal layer includes tungsten, and
the third metal layer includes aluminum.

* * * * *